US009570156B1

(12) United States Patent
Braceras et al.

(10) Patent No.: US 9,570,156 B1
(45) Date of Patent: Feb. 14, 2017

(54) DATA AWARE WRITE SCHEME FOR SRAM

(71) Applicant: GLOBALFOUNDRIES Inc., Grand Cayman (KY)

(72) Inventors: George M. Braceras, Essex Junction, VT (US); Venkatraghavan Bringivijayaraghavan, Tamilnadu (IN); Sheikh S. Chishti, Imphal (IN)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/832,127

(22) Filed: Aug. 21, 2015

(51) Int. Cl.
*G11C 11/00* (2006.01)
*G11C 11/419* (2006.01)
*G11C 5/14* (2006.01)
*G11C 11/412* (2006.01)
*G11C 11/413* (2006.01)

(52) U.S. Cl.
CPC .......... *G11C 11/419* (2013.01); *G11C 5/14* (2013.01); *G11C 5/147* (2013.01); *G11C 11/412* (2013.01); *G11C 11/413* (2013.01)

(58) Field of Classification Search
CPC .... G11C 11/419; G11C 11/412; G11C 11/413; G11C 5/14; G11C 5/147; G11C 11/4074
USPC ......... 365/156, 154, 189.09, 189.06, 189.16, 365/226
See application file for complete search history.

(56) References Cited

U.S. PATENT DOCUMENTS

| 7,733,686 B2 | 6/2010 | Clinton |
| 7,936,623 B2 * | 5/2011 | Deng .................... G11C 11/412 |
| | | 365/154 |
| 8,331,187 B2 * | 12/2012 | Houston ............... G11C 11/413 |
| | | 365/154 |
| 8,520,429 B2 | 8/2013 | Behrends et al. |
| 8,693,237 B2 | 4/2014 | Jou et al. |
| 8,730,712 B2 | 5/2014 | Choi |
| 2009/0235171 A1 | 9/2009 | Adams et al. |
| 2010/0199021 A1 | 8/2010 | Harper et al. |
| 2012/0008377 A1 | 1/2012 | Chuang et al. |
| 2012/0170388 A1 | 7/2012 | Choi |
| 2012/0307574 A1 | 12/2012 | Cheng et al. |

(Continued)

FOREIGN PATENT DOCUMENTS

| WO | 2007137062 A3 | 11/2007 |
| WO | 2014105013 A1 | 7/2014 |
| WO | 2014159262 A1 | 10/2014 |

OTHER PUBLICATIONS

Chang et al., "A differential data-aware power-supplied (D AP) 8T SRAM cell with expanded write/read stabilities for lower VDDmin applications" Solid-State Circuits, IEEE Journal of 45, No. 6, 2010, 1234-1245.

(Continued)

*Primary Examiner* — David Lam
(74) *Attorney, Agent, or Firm* — Anthony Canale; Andrew M. Calderon; Roberts Mlotkowski Safran Cole & Calderon, P.C.

(57) ABSTRACT

Approaches for providing write-assist for a Static Random Access Memory (SRAM) array are provided. A circuit includes a control circuit connected to a cell in a SRAM array. The control circuit is configured to: apply a first voltage to a first pull down transistor of the cell during a write operation to the cell; and apply a second voltage, different than the first voltage, to a second pull down transistor of the cell during the write operation.

20 Claims, 5 Drawing Sheets

(56) References Cited

U.S. PATENT DOCUMENTS

2013/0021864 A1* 1/2013 Deng .................. G11C 29/50
365/201
2014/0003181 A1 1/2014 Wang et al.
2015/0146479 A1 5/2015 Pilo

OTHER PUBLICATIONS

Wu et al., "A 45-nm dual-port SRAM utilizing write-assist cells against simultaneous access disturbances", Circuits and Systems II: Express Briefs, IEEE Transactions on 59, No. 11, 2012, 790-794.
Wang et al., "Dynamic Behavior of SRAM Data Retention and a Novel Transient Voltage Collapse Technique for 0.6V 32nm LP SRAM", IEEE, 2011, 4 pages.
Chandra et al.,"On the Efficacy of Write-Assist Techniques in Low Voltage Nanoscale SRAMs", EDAA, 2010, 6 pages.
Sharma et al., "Reliability Aware Negative Bit-Line Voltage Write Assist Scheme for SRAM", International Journal of Advanced Research in Computer Science and Software Engineering, vol. 3, Issue 8, Aug. 2013, pp. 918-925.

\* cited by examiner

DATA AWARE WRITE SCHEME FOR SRAM

FIELD OF THE INVENTION

The invention relates to semiconductor devices and, more particularly, to static random access memory (SRAM) devices and methods of manufacturing the same.

BACKGROUND

Static random access memory (SRAM) is a type of semiconductor memory used in many integrated circuit applications, from embedded memory (e.g., as cache memory and register files) in general purpose processors and application specific integrated circuits to external memories. SRAM is a desirable type of memory due to its high-speed, low power consumption, and simple operation. Unlike dynamic random access memory (DRAM), SRAM does not need to be regularly refreshed to retain the stored data, and its design is generally straightforward.

A typical SRAM cell includes a pair of cross-coupled inverters that hold a desired data bit value (i.e., either a 1 or a 0) and the complement of that value. While SRAM is a desirable type of memory, it is known that if not properly designed and fabricated, an SRAM cell can become unstable when accessed, at which point the held bit value is upset, i.e., switches. Moreover, the stability of an SRAM cell is in full conflict with the writeability of the cell with respect to the strengths of the N-type devices (transistors) and P-type devices (transistors) within the cell. Readability of an SRAM cell is the ability drive a required signal magnitude onto the bitline within a specified time allocated for signal development, and is a function of the read current of the cell. There tends to be a performance conflict between stability and readability/writeability in such cells. Techniques that increase stability typically have the adverse effect of decreasing readability/writeability. Conversely, techniques that increase readability/writeability typically have the adverse effect of decreasing stability.

SUMMARY

In a first aspect of the invention, there is a circuit including a control circuit connected to a cell in a Static Random Access Memory (SRAM) array. The control circuit is configured to: apply a first voltage to a first pull down transistor of the cell during a write operation to the cell; and apply a second voltage, different than the first voltage, to a second pull down transistor of the cell during the write operation.

In another aspect of the invention, there is a circuit including a control circuit connected to a cell in a Static Random Access Memory (SRAM) array. The control circuit is configured to: apply a first voltage to a first pull down transistor of the cell; and apply a second voltage to a second pull down transistor of the cell. The second voltage is configured to be different than the first voltage based on write data applied to the cell.

In another aspect of the invention, there is a method of providing write-assist in a cell of a Static Random Access Memory (SRAM) array. The method includes: applying a first voltage to a first pull down transistor of the cell during a write operation to the cell; and applying a second voltage, different than the first voltage, to a second pull down transistor of the cell during the write operation.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor devices and, more particularly, to static random access memory (SRAM) devices and methods of manufacturing the same. According to aspects of the invention, during a write operation to an SRAM cell, a first voltage is applied to first pull down transistor of the cell, and a second voltage different than the first voltage is applied to a second pull down transistor of the cell. In embodiments, the first voltage is VSS (e.g., ground) and the second voltage is greater than VSS by an amount defined by a control circuit. In embodiments, the second (higher) voltage is only applied to cells of a selected column, and is not applied to cells of a half-selected column. In embodiments, the first (lower) voltage is applied to the pull down transistor associated with a storage node of the SRAM cell where a value of "0" is being written, and the second (higher) voltage is applied to the pull down transistor associated with a storage node of the SRAM cell where a value of "1" is being written. In this manner, implementations of the invention provide a data aware write assist scheme for an SRAM cell.

In one aspect of the invention, there is a circuit including a control circuit connected to a cell in a Static Random Access Memory (SRAM) array. The control circuit is configured to: apply a first voltage to a first pull down transistor of the cell; and apply a second voltage to a second pull down transistor of the cell. The second voltage is configured to be different than the first voltage based on write data applied to the cell. This assists in the Write operation.

In another aspect of the invention, there is a modified control circuit connected to the cell of a Static Random Access Memory (SRAM) array. The modified control circuit is configured to: apply a first voltage to a first pull down transistor of the cell during a write operation to the cell; and apply a second voltage, different than the first voltage, to a second pull down transistor of the cell during the write operation. This assists in the Write operation.

As described herein, an SRAM may employ a write assist technique such as negative bit line write assist, whereby a bit line is provided with a negative voltage "boost" during a write operation that increases the strength of a bit cell's access transistor and thus increases the ability to reliably write to that bit cell. The boost may be provided by a capacitor in a write driver circuit. However, increasing the boost capacitance alone is not sufficient in some cases, since there is a need to attenuate the boost at higher voltages. Aspects of the invention described herein provide a data aware write assist technique in which a sink voltage applied to one of the pull down transistors of an SRAM cell is increased above a nominal ground potential during a write operation involving the cell.

Figure 1:
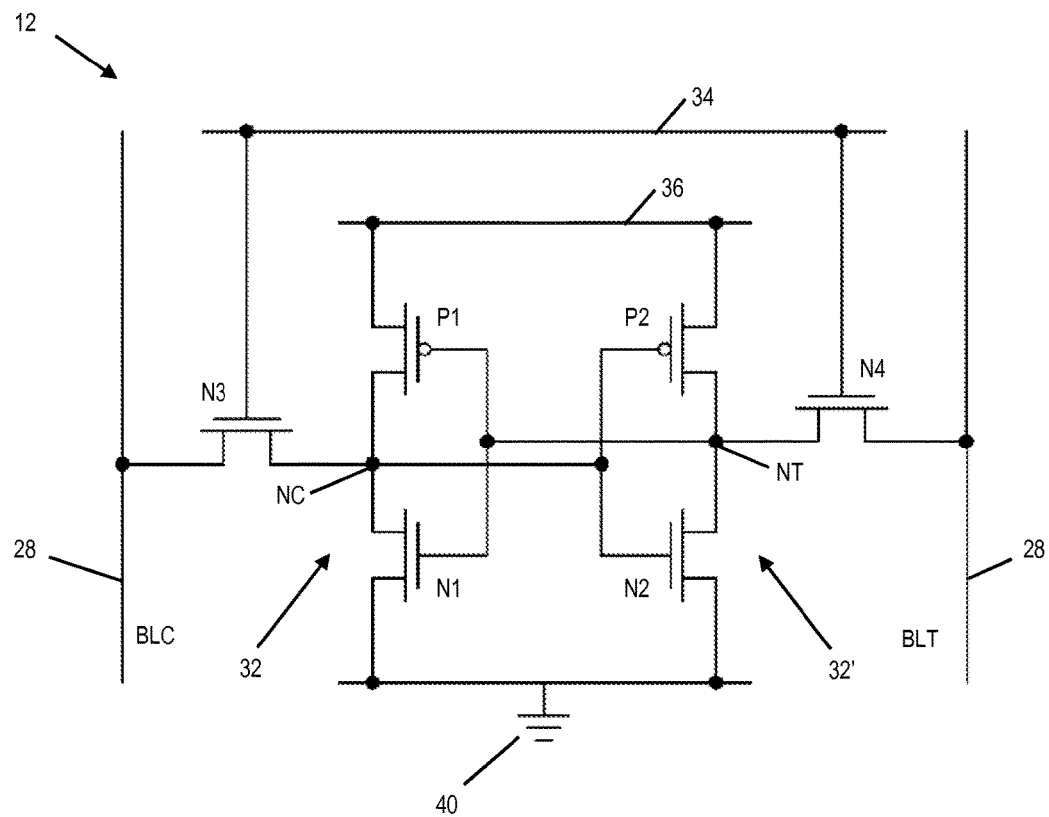
FIG. 1 depicts an SRAM cell.

FIG. 1 depicts an exemplary 6T SRAM cell 12 that may be included in an array. Cell 12 includes a pair of cross-coupled inverters 32, 32' each formed by one of a pair p-type load (or pull-up) transistors P1, P2 electrically connected to a voltage source line 36 and a corresponding one of a pair of n-type drive (or pull-down) transistors N1, N2 electrically connected to a voltage sink line 40, e.g., ground. Together, cross-coupled inverters 32, 32' form a latch circuit that is capable of storing a single data bit. Cell 12 has two stable states used to denote a "1" bit and a "0" bit, respectively, on internal storage nodes NC, NT. Two additional n-type transistors N3, N4, called "access" or "pass-gate" transistors, electrically connect cross-coupled inverters 32, 32' to corresponding respective ones of bit lines BLC, BLT (28) and are controlled by a corresponding wordline WL (34).

In operation, the bit lines BLT, BLC are typically precharged to a high voltage (at or near power supply voltage), and are equalized to the same voltage at the beginning of both read and write cycles, after which the bit lines BLT, BLC then float at that precharged voltage. To access cell 12 for a read operation, the word line WL is then energized, turning on pass transistors N3, N4, and connecting storage nodes NT, NC to the then-floating precharged bit lines BLT, BLC. The differential voltage developed on bit lines BLT, BLC is then sensed and amplified by a sense amplifier. In a write operation, typical modern SRAM memories include write circuitry that pulls one of then-floating precharged bit lines BLT or BLC low (i.e., to a voltage at or near ground voltage), depending on the data state to be written. Upon word line WL then being energized, the low level bit line BLT (or BLC) will pull down its associated storage node NT (or NC), causing the cross-coupled inverters of addressed cell 12 to latch in the desired state.

Device variability can cause read and write failures, particularly in memory cells constructed with sub-micron minimum feature size transistors. A write failure occurs when an addressed SRAM cell does not change its stored state when written with the opposite data state. Typically, this failure has been observed to be due to the inability of write circuitry to pull down the storage node currently latched to a high voltage. For example, in an attempt to write a low logic level to storage node NC, if bit line BLC is unable to sufficiently discharge storage node NC to trip the inverter 32' composed of transistors P2 and N2, cell 12 may not latch to the desired data state. Cell stability failures are the converse of write failures meaning that a write failure occurs when a cell fails to change its state when the change is intended, while a cell stability failure occurs when a cell changes its state when the change is not intended.

Figure 2:
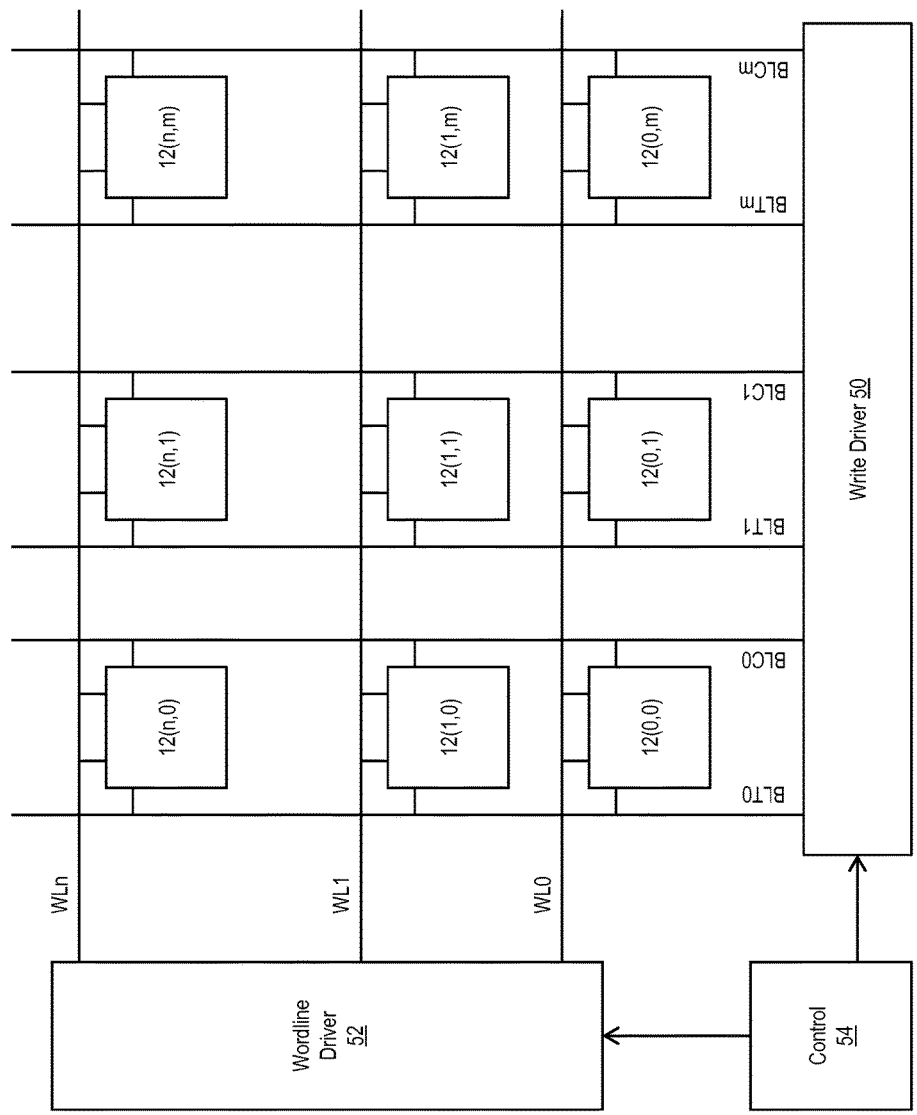
FIG. 2 depicts an SRAM array.

FIG. 2 shows an exemplary array of SRAM cells (each of which may be similar to cell 12 of FIG. 1) and an associated write driver 50 and wordline driver 52. The cells of the array are arranged in "n" rows and "m" columns where "n" and "m" may be any desired integers. Each cell in a particular row is operatively connected to a common wordline for that row. For example, cells 12(0,0), 12(0,1), . . . , 12(0,m) are connected to wordline WL0. Each cell in a particular column is operatively connected to a pair of common bitlines for that column. For example, cells 12(0,0), . . . , 12(n,0) are connected to bitlines BLC0 and BLT0. Control 54 contains control logic and provides control signals to the write driver 50 and wordline driver 52 for controlling read operations and write operations at the cells 12(0,0), . . . , 12(n,m).

Figure 3:
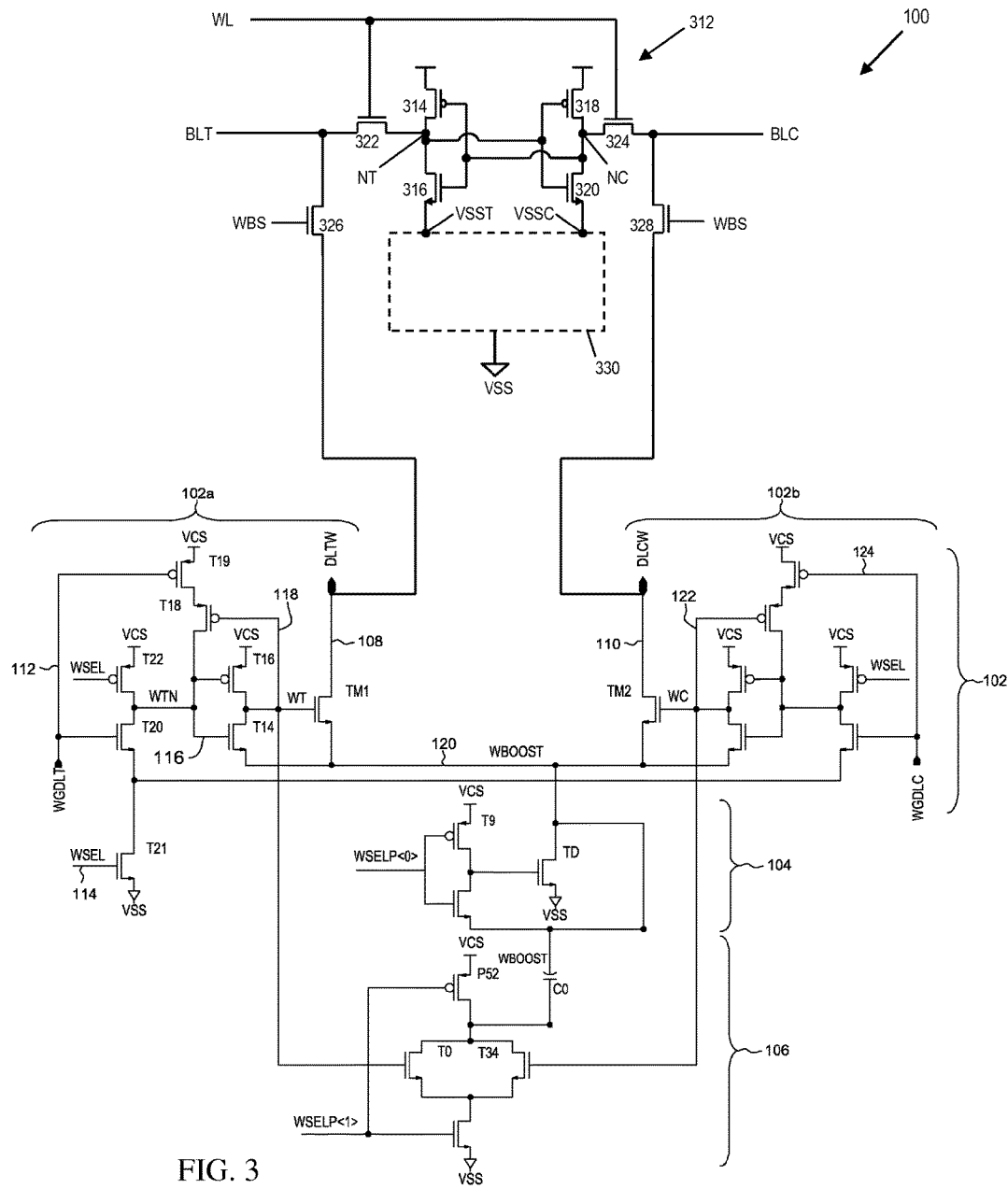
FIGS. 3-7 show circuits in accordance with aspects of the invention.

FIG. 3 shows an embodiment of a circuit 100 in accordance with aspects of the invention. The circuit 100 is shown with circuitry that may be included in a write driver such as write driver 50 of FIG. 2, for example. In embodiments, the circuit 100 includes: data line discharge control logic section 102; bit line ground discharge logic section 104; and boost capacitor charge logic section 106. Data line discharge control logic section 102 can be further subdivided into two sub-sections, 102a for data line true write (DLTW) 108, and 102b for data line complement write (DLCW) 110. These data lines drive writes to one or more SRAM bit cells through bit-switch transistors 326 and 328 which connect to bit line true (BLT) and bit line complement (BLC), respectively, of the SRAM cell 312, as described herein. In aspects described herein, one power supply operating at a lower voltage, VDD (e.g., 0.8 volts), is used to power the SRAM periphery, while another power supply operating at a higher voltage, VCS (e.g., 1.0 volts), is used to power the memory array, including the bit cells. Voltage level shifting is used to translate signals between these two voltage domains.

Section 102a is a voltage level shifter for global write signal (write global data line) true (WGDLT) 112. When high, WGDLT 112 is at VDD. When write select (WSEL) 114 is also high, N-type field effect transistor (NFET) T20 and NFET T21 are on, while P-type field effect transistor (PFET) T19 and PFET T22 are off. This brings control node write true negative (WTN) 116 to ground (VSS). With WTN 116 at ground, PFET T16 is on while NFET T14 is off, bringing node write true (WT) 118 to VCS. Thus, section 102a translates the lower VDD-level write signal WGDLT 112 to the higher VCS-level write signal WT 118. This allows NFET TM1 to be fully on, and permits a faster discharge of DLTW 108 than if WT 118 were at the lower VDD voltage level.

In more general terms, discharge of DLTW 108 is VCS-driven through TM1 using a NAND plus INV (that is, a NOT AND followed by a NOT) logic structure in the voltage level shifter. Section 102a also contains a partially-broken feedback, or quasi-feedback, system that maintains control node WTN 116 at VCS via T18 in response to WGDLT 112 being de-activated. When DLTW 108 is the unselected data line of data line pair complements DLTW 108 and DLCW 110, control node WT 118 gets negative write boost (WBOOST) 120 (discussed further below) for complete shut-off of TM1. This permits a VCS-based boost signal to be used while isolating boost potential to DLCW 110 and thus maximizing boost effectiveness. Section 102b works in an analogous fashion to section 102a, shifting write global data line complement (WGDLC) 124 from a VDD-based signal to a VCS-based signal at node write complement (WC) 122 to control discharge of DLCW 110 via NFET TM2.

Section 104 of the circuit 100 contains the bit line ground discharge logic. When activated via a low signal (write-assist control bit) WSELP<0>, data line DLTW 108 or DLCW 110, selected via circuit section 102 as described above, discharges to ground via node WBOOST 120 and NFET TD. The discharge is VCS driven through PFET T9, and shuts off before boost capacitor C0 is discharged when WSELP<0> goes high.

Section 106 of the circuit 100 contains the boost capacitor charge logic. A low write-assist control bit WSELP<1> charges boost capacitor C0. This is a VCS-based charge, applied via PFET P52, so the boost potential is greater than that from a VDD-based boost circuit. Capacitor C0 is discharged with a high WSELP<1> signal to provide a negative write boost to the selected data line DLTW 108 or DLCW 110 via WBOOST 120. The WSELP<1> signal is timed to trigger the negative boost only after the voltage of the data write line has been discharged to reach or exceed a threshold value relative to the ground voltage level. In embodiments, WSEL, WSELP<0>, WSELP<1>, WGDLT, and WGDLC are control signals provided by a control block inside the memory, such as control 54 shown in FIG. 2.

Still referring to FIG. 3, the circuit 100 includes an SRAM cell 312 which is similar to cell 12 of FIG. 1. For example, the cell 312 includes a pull up transistor 314 and a pull down transistor 316 associated with a true storage node NT, and a pull up transistor 318 and a pull down transistor 320 associated with a complement storage node NC. The cell 312 includes two pass-gate transistors 322 and 324 that electrically connect the cross-coupled inverters to corresponding respective ones of bit lines BLT and BLC, and that are controlled by a corresponding wordline WL. The bitlines BLT and BLC are connected to write driver circuitry by write bit-switches 326 and 328 that are controlled by a WBS signal provided by control circuitry (such as control 54 of FIG. 2). The cell 312 may be included in an array of SRAM cells in the manner illustrated in FIG. 2. For example, cell 312 of FIG. 3 may correspond to cell 12(0,0) of FIG. 2, bitlines BLT and BLC of FIG. 3 may correspond to bitlines BLT0 and BLC0 of FIG. 2, and wordline WL of FIG. 3 may correspond to wordline WL0 of FIG. 2.

As shown in FIG. 3, the circuit 100 includes a control circuit 330 connected between the pull down transistors 316 and 320 and VSS (e.g., ground). According to aspects of the invention, during a write operation to the cell 312, the control circuit 330 provides a first voltage VSST at a source of the pull down transistor 316 and a second voltage VSSC at a source of the pull down transistor 320, as opposed to both transistors 316 and 320 being connected directly to VSS (ground). As VSST and VSSC are applied at the source terminals of the respective pull down NFETs 316 and 320, these voltages may be considered sink voltages. In embodiments, during a write operation to the cell 312, one of VSST and VSSC is set equal to VSS, and the other of VSST and VSSC is set at a voltage level slightly higher than VSS. This increase of one of VSST and VSSC above the VSS level enhances the write operation by weakening (e.g., lowering the Vgs of) an appropriate one of the pull up transistors and an appropriate one of the pull down transistors in the cell 312, thus making it easier for the values at the storage nodes NT and NC to change state. In embodiments, the adjustment of one of VSST and VSSC is applied only at the selected column involved in the write operation, and is not applied at half-selected columns. In preferred embodiments, the adjustment of one of VSST and VSSC is applied only for the half of the cell 312 where the storage node (NT or NC) is being written with a value of 1 from an initial state of 0. Implementations of the control circuit 330 are described in greater detail with respect to FIGS. 4-7.

Figure 4:
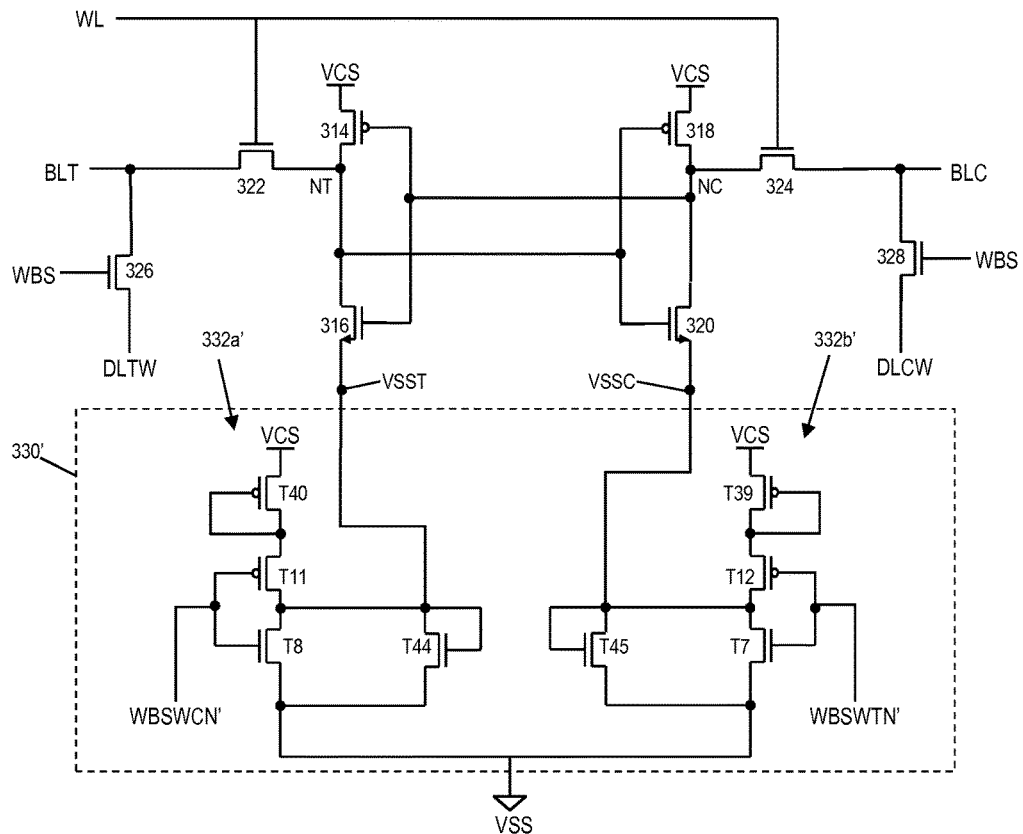

FIG. 4 illustrates an implementation of the control circuit 330' in accordance with aspects of the invention. In embodiments, the control circuit 330' includes a first section 332a' that controls the voltage VSST applied to the pull down NFET 316 during a write operation to the cell 312, and a second section 332b' that controls the voltage VSSC applied to the pull down NFET 320 during a write operation to the cell 312.

In embodiments, the first section 332a' includes a diode connected NFET T44 connected to the source of the pull down NFET 316. Diode connected PFET T40, PFET T11, and NFET T8 are connected in series between VCS and VSS. The drain of NFET T44 is connected to the drain of NFET T8 and to the drain of PFET T11. The source of NFET T44 is connected to the source of NFET T8, i.e., to VSS. Trigger signal WBSWCN' is applied to the gate of NFET T8 and to the gate of PFET T11. The control circuit 330' is structured and arranged such that when WBSWCN' is high, VSST equals VSS. The control circuit 330' is structured and arranged such that when WBSWCN' is low, VSST equals VSS plus a predetermined voltage, i.e., VSST is higher than VSS by the predetermined voltage. The amount of the predetermined voltage is defined by VCS and the sizes of the diode connected PFET T40 and the diode connected NFET T44. In embodiments, the diode connected PFET T40 and the diode connected NFET T44 are sized such that the predetermined voltage is in a range of 25 mV to 265 mV, although other levels may be used in implementations. The diode connected NFET T44 also operates as a clamp to restrict the amount of the increase of VSST above VSS at high voltage corners.

In embodiments, the second section 332b' includes a diode connected NFET T45 connected to the source of the pull down NFET 320. Diode connected PFET T39, PFET T12, and NFET T7 are connected in series between VCS and VSS. The drain of NFET T45 is connected to the drain of NFET T7 and to the drain of PFET T12. The source of NFET T45 is connected to the source of NFET T7, i.e., to VSS. Trigger signal WBSWTN' is applied to the gate of NFET T7 and to the gate of PFET T12. The control circuit 330' is structured and arranged such that when WBSWTN' is high, VSSC equals VSS. The control circuit 330' is structured and arranged such that when WBSWTN' is low, VSSC equals VSS plus a predetermined voltage, i.e., VSSC is higher than VSS by the predetermined voltage. The amount of the predetermined voltage is defined by VCS and the sizes of the diode connected PFET T39 and the diode connected NFET T45. In embodiments, the diode connected PFET T39 and the diode connected NFET T45 are sized such that the predetermined voltage is in a range of 25 mV to 265 mV, although other levels may be used in implementations. The diode connected NFET T45 also operates as a clamp to restrict the amount of the increase of VSSC above VSS at high voltage corners.

Figure 5:
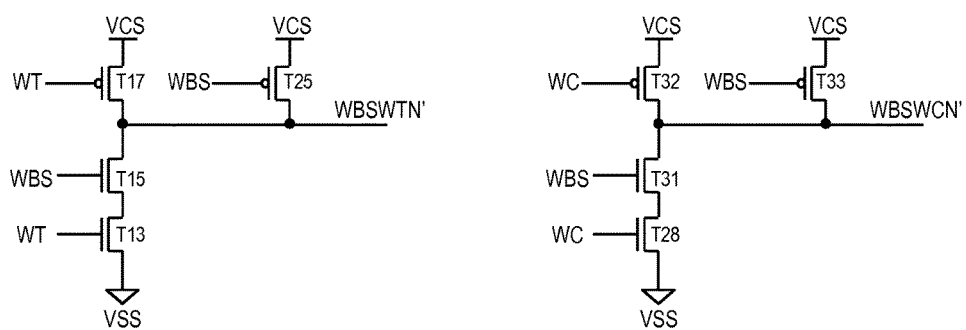

FIG. 5 shows circuits for generating the trigger signals WBSWCN' and WBSWTN' in accordance with aspects of the invention. In embodiments, WBSWTN' is the output of NAND logic having write true signal WT and bit-switch control signal WBS as two inputs, e.g., as shown by PFET T17, PFET T25, NFET T15, and NFET T13 connected in the manner shown in FIG. 5. In embodiments, WBSWCN' is the output of NAND logic having write complement signal WC and bit-switch control signal WBS as two inputs, e.g., as shown by PFET T32, PFET T33, NFET T31, and NFET T28 connected in the manner shown in FIG. 5. The WT, WC, and WBS signals may be obtained from the write driver circuitry shown in FIG. 3, for example. The circuits shown in FIG. 5 may be partially or completely included in the control circuit 330'.

An exemplary write operation is now described to illustrate the functionality of the control circuit 330' in accordance with aspects of the invention. The example is described with reference to FIGS. 3-5. In this example, prior to the write operation, the data at node NT of cell 312 has a value of 1, and that the data at node NC of cell 312 has a value of 0. The write operation involves writing a value of 0 to NT and writing a value of 1 to NC. To achieve this, WGDLT, WSEL, and WBS are driven high (e.g., VDD), and WGDLC is driven low (e.g., VSS). WGDLC being low results in WC being low. This drives WBSWCN' high, which results in VSST being equal to VSS. WGDLT being high results in WT being high (e.g., VCS). This drives WBSWTN' low, which results in VSSC being greater than VSS by the predetermined amount (D) defined by VCS, the diode connected PFET T39, and the diode connected NFET T45. This combination of VSST=VSS and VSSC=VSS+D weakens the pull up PFET 314 and the pull down NFET 320, which improves the response of the cell for the write operation (i.e., switching NT from 1 to 0 and switching NC from 0 to 1).

An individual instance of the control circuit 330' may be connected to each respective column of an SRAM array, e.g., at the bit-switch circuitry of each respective column. By utilizing the WBS signal to generate the WBSWCN' and WBSWTN' signals, aspects of the invention ensure that the VSS adjustment provided by the control circuit 330' is only applied to the selected column where the write operation is taking place, but not for half selected columns. Specifically, the WBS signal is low for half-selected columns, such that the WBSWCN' and WBSWTN' signals are both high, resulting in VSST and VSSC both equaling VSS for calls in the half selected columns. This makes aspects of the invention "data aware" since the VSS adjustment is only applied to cells in columns where data is being written. As additionally described herein, in the selected column where data is being written, the control circuit 330" is configured such that the adjustment making VSST or VSSC higher than VSS occurs only at the side of the cell where a value of 1 is being written (either to NC or NT).

Figure 6:
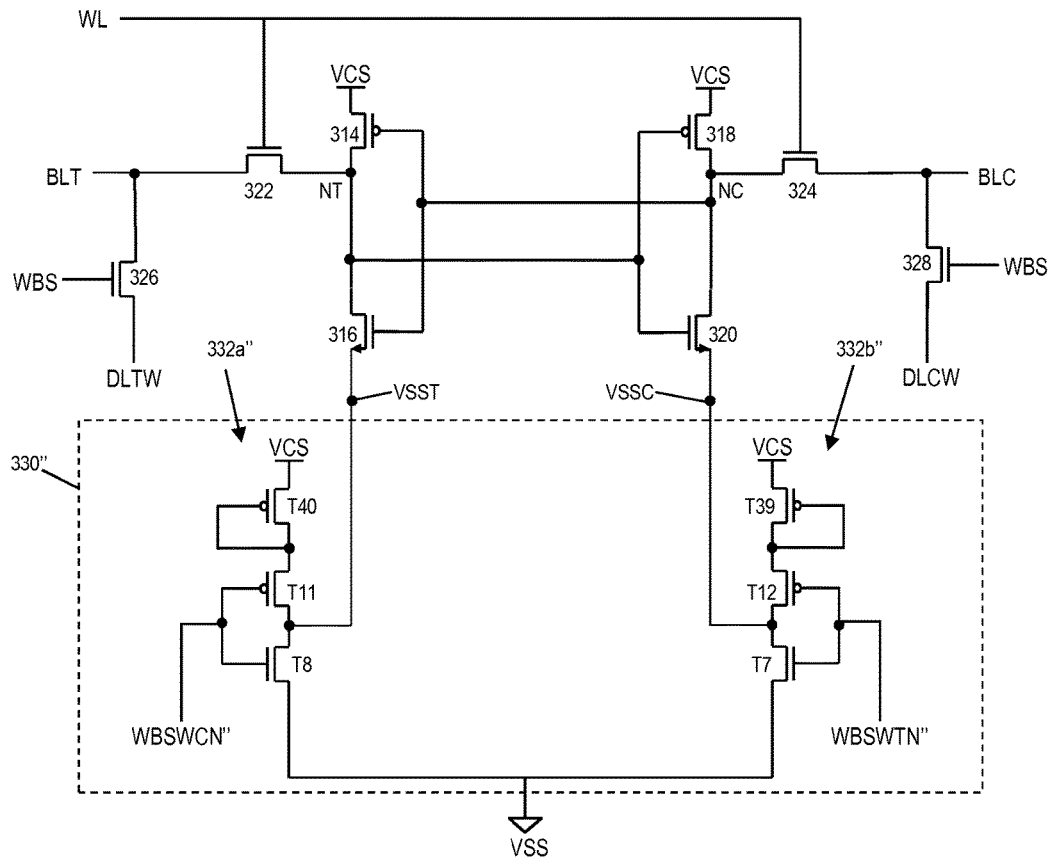

FIG. 6 illustrates another implementation of the control circuit 330" in accordance with aspects of the invention. In embodiments, the control circuit 330" includes a first section 332a" that controls a low level voltage VSST applied to the pull down NFET 316 during a write operation to the cell 312, and a second section 332b" that controls a low level voltage VSSC applied to the pull down NFET 320 during a write operation to the cell 312.

As shown in FIG. 6, the control circuit 330" includes a number of the same elements arranged in the same manner as the control circuit 330' of FIG. 4, and the description of these elements is not repeated. The first section 332a" shown in FIG. 6 differs from the first section 332a' of FIG. 4 in that the first section 332a" does not include a diode connected NFET. Similarly, the second section 332b" shown in FIG. 6 differs from the second section 332b' of FIG. 4 in that the second section 332b" does not include a diode connected NFET.

Figure 7:
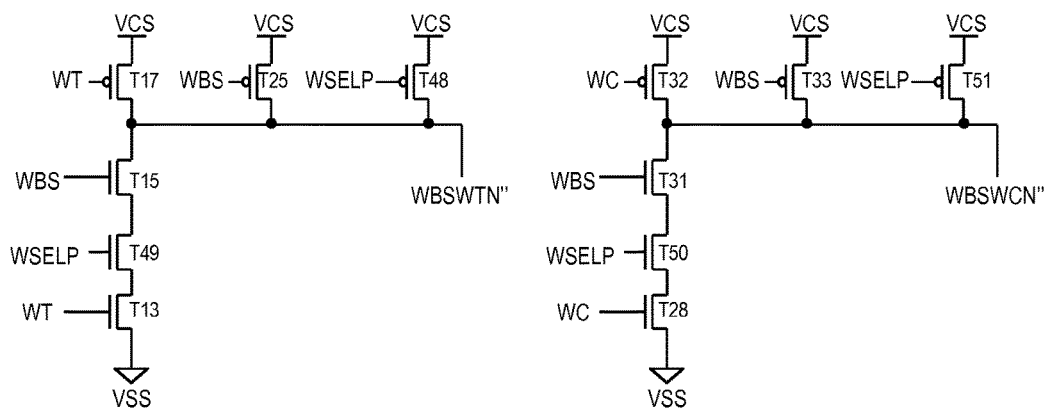

In embodiments, the trigger signals WBSWCN" and WBSWTN" are generated using write assist boost control signal WSELP<0>. For example, as shown in FIG. 7, WBSWTN" may be generated as the output of a three input NAND logic having WT, WBS, and WSELP<0> as inputs. As further shown in FIG. 7, WBSWCN" may be generated as the output of a three input NAND logic having WC, WBS, and WSELP<0> as inputs. The trigger signals WBSWCN" and WBSWTN" are thus gated with WSELP<0>, where the boost attenuation circuit prevents WSELP<0> from going high at high voltage corners. In this manner, the control circuit 330" does not increase either of VSST and VSSC higher than VSS when WSELP<0> is low, e.g., during boost attenuation, such that VSST and VSSC both remain equal to VSS as high voltage corners. On the other hand, when boost attenuation is not applied (e.g., WSELP<0> is high) during the write operation to the cell 312, then one or the other of VSST and VSSC is increased higher than VSS in a manner similar to that described with respect to FIGS. 4 and 5. The circuits shown in FIG. 7 may be partially or completely included in the control circuit 330".

Similar to control circuit 330', an individual instance of the control circuit 330" may be connected to each respective column of an SRAM array, e.g., at the bit-switch circuitry of each respective column. By utilizing the WBS signal to generate the WBSWCN" and WBSWTN" signals, aspects of the invention ensure that the VSS adjustment provided by the control circuit 330" is only applied to the selected column where the write operation is taking place, but not for half selected cells. As additionally described herein, in the selected column where data is being written, the control circuit 330" is configured such that the adjustment making VSST or VSSC higher than VSS occurs only at the side of the cell where a value of 1 is being written (either to NC or NT).

The structures (e.g., circuits) of the present invention can be implemented in semiconductor structures, which can be manufactured in a number of ways using a number of different tools. In general, though, the methodologies and tools are used to form the semiconductor implementations with dimensions in the micrometer and nanometer scale. The methodologies, i.e., technologies, employed to manufacture the semiconductor implementations have been adopted from integrated circuit (IC) technology. For example, the semiconductor implementations are built on wafers and are realized in films of material patterned by photolithographic processes on the top of a wafer. In particular, the fabrication of the semiconductor implementations uses three basic building blocks: (i) deposition of thin films of material on a substrate, (ii) applying a patterned mask on top of the films by photolithographic imaging, and (iii) etching the films selectively to the mask.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A circuit, comprising:
   a control circuit connected to a cell in a Static Random Access Memory (SRAM) array, wherein the control circuit is configured to:
   apply a first voltage to a first pull down transistor of the cell during a write operation to the cell; and
   apply a second voltage, different than the first voltage, to a second pull down transistor of the cell during the write operation,
   wherein a trigger signal causes the second voltage to be different than the first voltage, the trigger signal being based on a bit-switch signal that controls a bit-switch connected to the cell.

2. The circuit of claim 1, wherein:
the first voltage equals a ground voltage; and
the second voltage is greater than the ground voltage.

3. The circuit of claim 2, wherein the second voltage is greater than the ground voltage by an amount defined by the control circuit.

4. The circuit of claim 1, wherein the trigger signal is based on a write-assist boost control signal.

5. The circuit of claim 2, wherein:
the first pull down transistor is connected to a first storage node of the cell; and
the second pull down transistor is connected to a second storage node of the cell.

6. The circuit of claim 5, wherein:
the second storage node has a data value of "0" prior to the write operation; and
the write operation writes a data value of "1" to the second storage node.

7. The circuit of claim 1, wherein:
the first voltage is a first sink voltage applied to a source of the first pull down transistor; and
the second voltage is a second sink voltage applied to a source of the second pull down transistor.

8. The circuit of claim 1, wherein:
the cell is included in a column of the SRAM array;
the control circuit is connected to all cells in the column of the SRAM array.

9. The circuit of claim 1, wherein the circuit includes a clamp that attenuates the second voltage at high voltage corners.

10. The circuit of claim 9, wherein the clamp comprises a diode connected n-type field effect transistor.

11. The circuit of claim 1, wherein, during the write operation, the second voltage is applied to cells of a selected column of the array.

12. The circuit of claim 11, wherein, during the write operation, the second voltage is not applied to cells of a half-selected column of the array.

13. A circuit, comprising:
a control circuit connected to a cell in a Static Random Access Memory (SRAM) array, wherein the control circuit is configured to:
apply a first voltage to a first pull down transistor of the cell; and
apply a second voltage to a second pull down transistor of the cell, wherein the second voltage is configured to be different than the first voltage based on write data applied to the cell,
wherein the control circuit generates the first voltage based on a first trigger signal that is based on a bit-switch control signal and a write true signal; and
the control circuit generates the second voltage based on a second trigger signal that is based on the bit-switch control signal and a write complement signal.

14. The circuit of claim 13, wherein:
the first trigger signal is based on the bit-switch control signal, the write true signal, and a write-assist boost control signal; and
the second trigger signal is based on the bit-switch control signal, the write complement signal, and the write-assist boost control signal.

15. The circuit of claim 13, wherein:
the first voltage is a first sink voltage equal to ground; and
the second voltage is a second sink voltage greater than ground.

16. The circuit of claim 13, wherein, during the write operation, the second voltage is applied only to cells of a selected column of the array and is not applied to cells of a half-selected column of the array.

17. A method of providing write-assist in a cell of a Static Random Access Memory (SRAM) array, comprising:
applying a first voltage to a first pull down transistor of the cell during a write operation to the cell;
applying a second voltage, different than the first voltage, to a second pull down transistor of the cell during the write operation;
controlling the first voltage based on a bit-switch control signal and a write true signal; and
controlling the second voltage based on the bit-switch control signal and a write complement signal.

18. The method of claim 17, wherein:
the controlling the first voltage comprises controlling the first voltage based on the bit-switch control signal, the write true signal, and a write-assist boost control signal; and
the controlling the second voltage comprises controlling the second voltage based on the bit-switch control signal, the write complement signal, and the and a write-assist boost control signal.

19. The method of claim 17, wherein, during the write operation, the second voltage is applied to cells of a selected column of the array.

20. The method of claim 19, wherein, during the write operation, the second voltage is not applied to cells of a half-selected column of the array.

* * * * *